United States Patent
Wang

(10) Patent No.: US 11,685,483 B2
(45) Date of Patent: Jun. 27, 2023

(54) INFLATABLE NON-IMAGING NON-TRACKING SOLAR CONCENTRATOR BASED SOLAR POWERED ELECTRIC SHIPS

(71) Applicant: Yonghua Wang, Klamath Falls, OR (US)

(72) Inventor: Yonghua Wang, Klamath Falls, OR (US)

(73) Assignee: Yonghua Wang, Klamath Falls, OR (US)

( * ) Notice: Subject to any disclaimer, the term of this patent is extended or adjusted under 35 U.S.C. 154(b) by 0 days.

(21) Appl. No.: 16/873,366

(22) Filed: Mar. 26, 2020

(65) Prior Publication Data

US 2022/0009600 A1 Jan. 13, 2022

(51) Int. Cl.
| | |
|---|---|
| H02J 7/00 | (2006.01) |
| B63B 35/28 | (2006.01) |
| B60L 50/60 | (2019.01) |
| B60L 53/20 | (2019.01) |
| B63H 1/14 | (2006.01) |
| B60L 8/00 | (2006.01) |
| H02S 40/22 | (2014.01) |
| B60L 58/10 | (2019.01) |
| B63H 21/17 | (2006.01) |

(52) U.S. Cl.
CPC ............. *B63B 35/28* (2013.01); *B60L 8/003* (2013.01); *B60L 50/60* (2019.02); *B60L 53/20* (2019.02); *B60L 58/10* (2019.02); *B63H 1/14* (2013.01); *H02S 40/22* (2014.12); *B63H 21/17* (2013.01); *B63H 2021/171* (2013.01)

(58) Field of Classification Search
None
See application file for complete search history.

(56) References Cited

U.S. PATENT DOCUMENTS

| | | | | |
|---|---|---|---|---|
| 2005/0208845 A1* | 9/2005 | Jansen | ................... | B63H 23/24 440/27 |
| 2006/0009092 A1* | 1/2006 | Krietzman | ............. | B63H 21/17 440/6 |
| 2010/0039061 A1* | 2/2010 | Rosenbaum | ............ | E02B 1/003 320/101 |
| 2010/0074686 A1* | 3/2010 | Towley, III | ............... | F03D 9/34 405/26 |
| 2012/0038210 A1* | 2/2012 | Kibbee | ..................... | H02J 3/32 320/101 |

(Continued)

*Primary Examiner* — Arun C Williams

(57) ABSTRACT

A solar powered electric ship system comprises an electric ship, multiple inflatable barges, and multiple inflatable non-imaging non-tracking solar concentrator based concentrating photovoltaic systems. The entire system is configured with the multiple inflatable non-imaging non-tracking solar concentrator based concentrating photovoltaic systems mounted on the inflatable barges, and with the inflatable barges mechanically and electrically connected to the electric ship. When in operation, the electric ship dragged the barges to navigate together with it, and have the inflatable non-imaging non-tracking solar concentrator based photovoltaic system to power it. The configuration dramatically reduce the battery bank size of the electric ship and make the portable floating concentrating photovoltaic system ultra-high efficiency, extremely low cost, and super light.

6 Claims, 7 Drawing Sheets

(56) References Cited

U.S. PATENT DOCUMENTS

| | | | | |
|---|---|---|---|---|
| 2012/0242275 A1* | 9/2012 | Kokusho | ............... | H02S 20/00 |
| | | | | 136/246 |
| 2012/0291847 A1* | 11/2012 | Rowe, Jr | ............... | H02S 30/20 |
| | | | | 320/101 |
| 2013/0240025 A1* | 9/2013 | Bersano | ............... | H02S 10/40 |
| | | | | 136/251 |
| 2014/0035509 A1* | 2/2014 | Baruh | ............... | H02K 7/1838 |
| | | | | 414/373 |
| 2016/0156304 A1* | 6/2016 | Smadja | ............... | B63B 35/44 |
| | | | | 136/251 |
| 2016/0368577 A1* | 12/2016 | Gaveau | ............... | F24S 20/70 |

* cited by examiner

INFLATABLE NON-IMAGING NON-TRACKING SOLAR CONCENTRATOR BASED SOLAR POWERED ELECTRIC SHIPS

TECHNICAL FIELD

The present disclosure relates generally to solar powered ships, more specifically, to inflatable non-imaging non-tracking solar concentrator based concentrating photovoltaic system powered electric ships.

BACKGROUND

Over 70% earth surface is covered by ocean and over 80% of cargo of international trade is transported through ocean shipping. As the entire world is accelerating in switching to renewable energy, a fundamental issue "how the sea transportation is powered in renewable energy" emerged. As the electrification of auto industry, the electrification of sea transportation is apparently one of the approaches to address the issue. However, it differentiates the electrification of auto industry in the sense that electric vehicle on land can be easily charged in time, but it is not easy to charge ships on sea.

Contrast to the current situation of fossil fuel driven ships, the fully battery powered electric ships needs to spend almost the entire transportation capacity of the cargoes to up load sufficient amount of battery to drive the ships over the long distance ocean shipping. The reason for that is due to the fact that the energy density of fossil fuel is 100-200 times of that of electric battery. If one wants to save the space and weight capacity for cargoes, the ships must carry much less battery and get those battery charged time by time. Obviously getting that battery charged time by time on sea presents a great challenge in front of scientists and engineers. Fortunately, the ubiquitously available solar energy provides a pathway to address that challenge. Solar energy is clean, abundant and locally available anywhere, no matter it is on land or on sea. Capturing the sunlight in its voyage to charge the electric ship time by time shows the most desirable solution. However, this approach requires vast area of solar collectors and paramount of the corresponding auxiliary equipment to construct a portable floating solar power plant to navigate along the electric ship. Economically, the current photovoltaic technology is unable to fulfill this task.

Solar Yacht is one of the very well known solar boats and some of these solar boats are used as ferry. Those boats are featured with the flat plate photovoltaic panels that cover the canopies of the boats to supply the power to the boats. Due to its low efficiency, high cost, and high self-weight, conventional photovoltaic panel is only used to power light boats or ships. For heavy duty cargo transportation, it is hard to imagine that the entire ship is powered by solar panels.

The dominant silicon semiconductor based flat plate panel directly uses the expensive semiconductor to collect and convert the diffused solar radiation, so it is inevitably expensive. For outdoor environmental usage, the semiconductor chips have to be packed into packages with heavy transparent materials and frame work, those add significant amount of weight to the panels. Normally, concentrating photovoltaic system is able to shrink the area of semiconductor needed to receive solar radiation and save the cost of the photovoltaic system, but conventional concentrating photovoltaic system needs sun tracking system, which is expensive and almost offsets the advantage of the concentrating system. In addition, the conventional rigid body solar concentrators are even heavier than the flat plate panels. Obviously, for the widely distributed diffused solar radiation to be able to power the heavy duty cargo ships, an extremely low cost, non-tracking, and super light concentrating photovoltaic system has to be created and developed, and a mechanism for utilizing such a system to power the heavy duty cargo ships have to be created and developed either.

The state of the art of the current photovoltaic technology has only reached the record conversion efficiency 46.5% and the conventional silicon solar cells have only approached to the record conversion efficiency of around 25%. The conversion efficiency of the current photovoltaic technology is not enough to support the real solar powered electric ship. In addition, the un-negligible self-weight of the current photovoltaic system prohibits the practical solar powered electric ship.

Taking into account of the collecting area of solar radiation, conversion efficiency, self-weight, and cost, to realize the practical solar powered electric ship, a revolutionary frame work of the solar powered electric ship and a design paradigm of the photovoltaic system for the solar powered electric ship must be created.

In order to extend the collection area of solar fields to provide enough power for driving electric ships, the present invention introduces portable floating inflatable non-imaging non-tracking solar concentrator based concentrating photovoltaic systems to power the electric ships. In stead of mounting flat plate panels on the canopies of boats, the present invention installs the inflatable non-imaging non-tracking solar concentrators based photovoltaic systems on inflatable barges to power electric ships. Normally, the electric ships with battery banks carry the inflatable barges with the inflatable photovoltaic systems. When in operation, the electric ships release the barges, and inflate them and the inflatable photovoltaic systems to supply power to electric ships.

The objectives of the present invention are: (1) to provide an inflatable non-imaging non-tracking high concentration ratio concentrating photovoltaic system and a floating portable solar collection and conversion system to power heavy duty cargo ships; (2) to provide an electric ship system configuration powered by a portable floating inflatable non-imaging non-tracking high concentration ratio concentrator based concentrating photovoltaic system.

SUMMARY

According to the present invention, multiple inflatable barges are taken to extend the canopy areas of electric ships to collect sunlight. The inflatable non-imaging non-tracking high concentration ratio solar concentrator based concentrating photovoltaic systems are mounted on the barges to generate electric power to power the electric cargo ships. The newly invented inflatable non-imaging non-tracking high concentration ratio solar concentrator with extremely low cost, will dramatically reduce the areas of semiconductor receivers of the concentrating photovoltaic systems without tracking. If the ultra-high efficiency photovoltaic cells are used to fabricate the receivers of the inflatable non-imaging non-tracking high concentration ratio solar concentrator based concentrating photovoltaic units, the entire concentrating photovoltaic systems will perform in an ultra-high efficiency. The inflatable non-imaging non-tracking high concentration ratio solar concentrator based concentrating photovoltaic system is super light. When it is integrated into an inflatable barge, a foldable solar collection and conversion system is constructed. Instead of carrying vast amount of fossil fuel, the electric cargo ships only need to carry a great number of inflatable barges with the inflatable non-imaging non-tracking high concentration ratio solar concentrator based concentrating photovoltaic system to generate power, when they are navigating on oceans. Apparently, if the barge equipped with the inflatable non-imaging non-tracking high concentration ratio solar concentrator based concentrating photovoltaic system, is added with an electric motor and a control system, the barge will become a boat driven by an ultra-high efficiency, extremely low cost and super light photovoltaic system.

Further aspects and advantages of the present invention will become apparent upon consideration of the following description thereof, reference being made of the following drawings.

BRIEF DESCRIPTION OF THE DRAWINGS

The accompanying drawings, which are incorporated in and constitute a part of this specification, illustrate several embodiments of the invention and together with the description, serve to explain the principles of the invention.

DETAILED DESCRIPTION

Reference will now be made in detail to the present exemplary embodiments, examples of which are illustrated in the accompanying drawings. Wherever possible, the same reference numbers will be used throughout the drawings to refer to the same or like parts.

Figure 1:
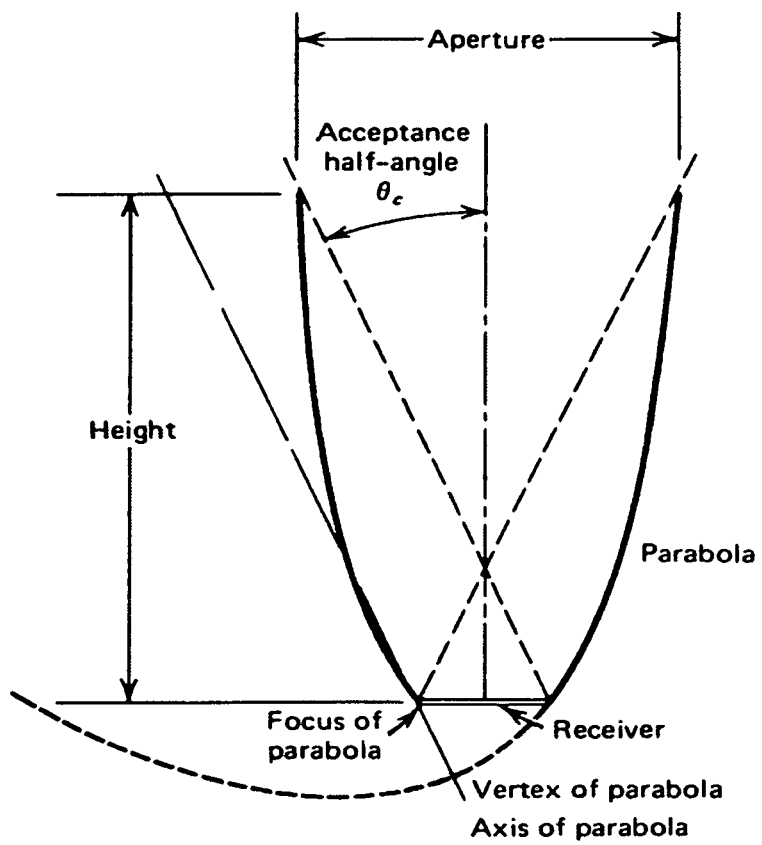
FIG. 1 is the prior art (John A. Duffie and William A. Beckman, Solar Engineering of Thermal Processes, 4th edition, pp 337-350, 2013) of a schematic drawing on construction of the Compound Parabolic Concentrator (CPC) concentrator, which introduces some key concepts such as acceptance half-angle $\theta_c$, focus of each of the parabolas, concentrator aperture, receiver, and axis of parabola.

Referring to FIG. 1, the prior art, a schematic drawing on construction of the CPC concentrator, which introduces some key concepts such as acceptance half-angle $\theta_c$, focus of each of the parabolas, concentrator aperture, receiver, and axis of parabola. The incident light, no matter beam light or diffuse light, as long as falling into the acceptance half-angle $\theta_c$, will be concentrated to the receiver.

Figure 2:
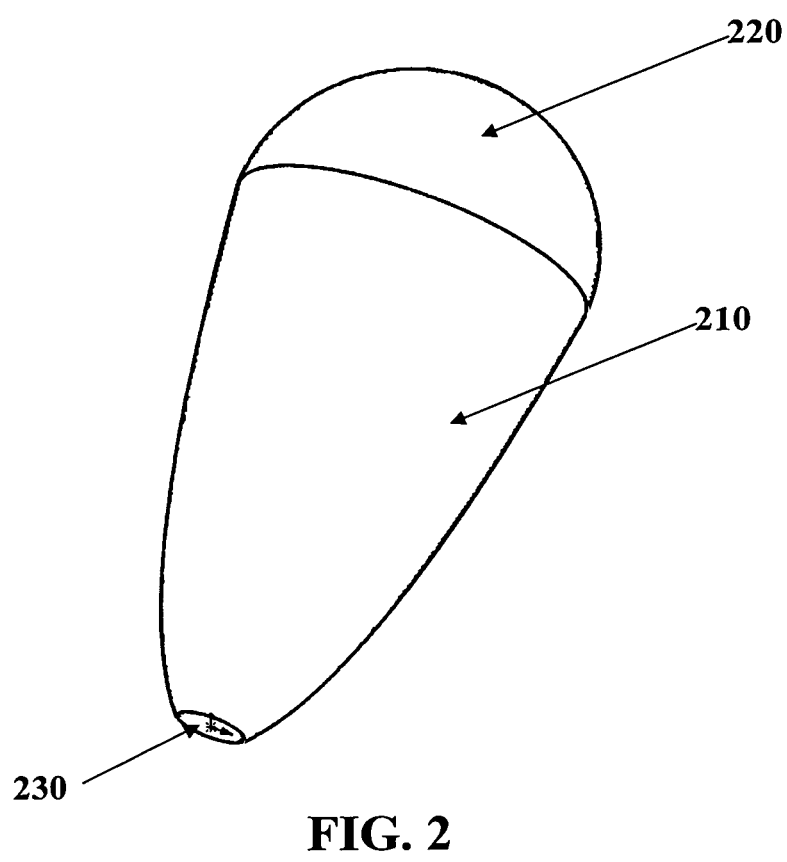
FIG. 2 is a schematic drawing of the inflatable non-imaging non-tracking concentrator which is the assembly of two clear membranes and a reflective membrane inflated into a CPC with a transparent cover on top and a transparent cover on bottom.

Referring to FIG. 2, the CPC 210 made of reflective membrane is covered with a transparent cover 220 on the top and covered with a transparent cover 230 on the bottom to form a sealed assembly with a gas gate on the top transparent cover. Then the assembly is inflated into a shape of CPC covered with a clear top and a bottom.

Figure 3:
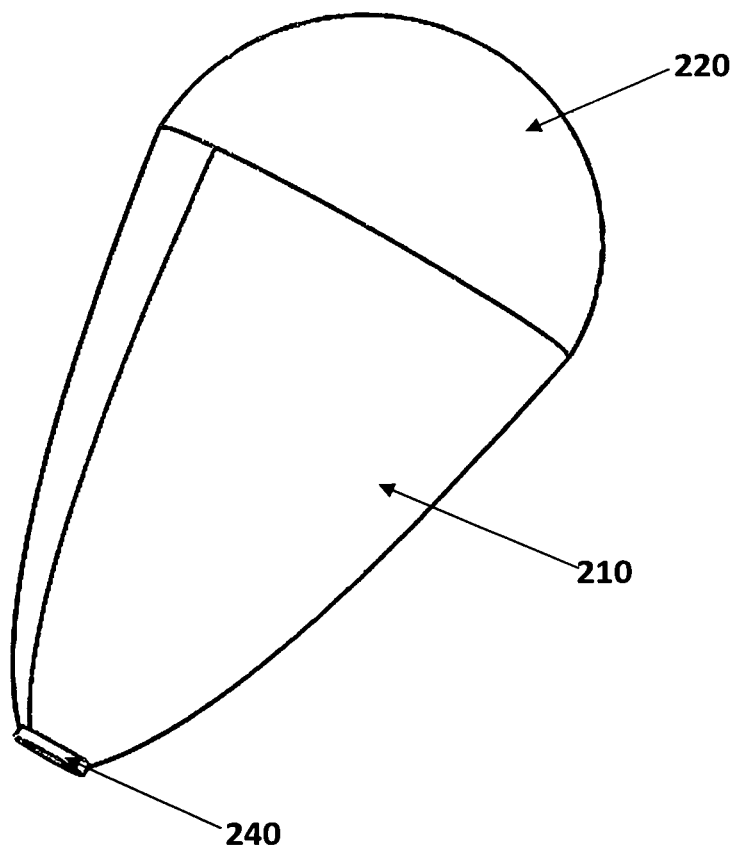
FIG. 3 is the inflatable non-imaging non-tracking concentrator based concentrating photovoltaic unit with a photovoltaic receiver.

Referring to FIG. 3, the inflatable non-imaging non-tracking solar concentrator indicated with 210, 220, 230, is integrated with the photovoltaic receiver 240 integrated with heat exchanger.

Figure 4:
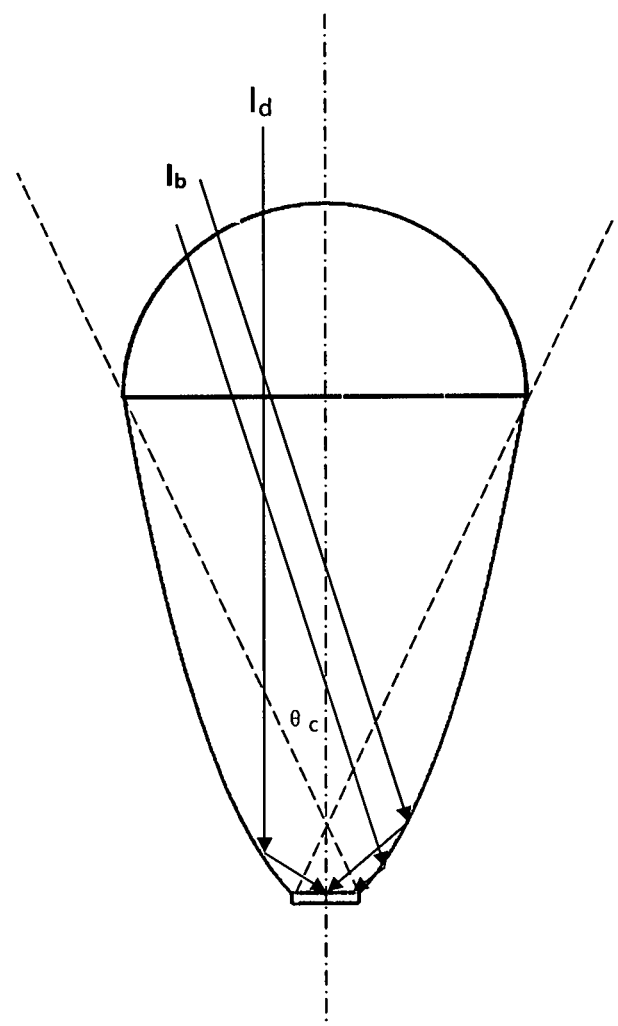
FIG. 4 is the schematic diagram showing the principle for CPC to concentrate both beam light and diffuse light.

Referring to FIG. 4, when in operation, both the beam light $I_b$ and the diffuse light $I_d$ are concentrated to the receiver, as long as both the $I_b$ and the $I_d$ fall in the half acceptance angle $\theta_c$ of the CPC.

Figure 5:
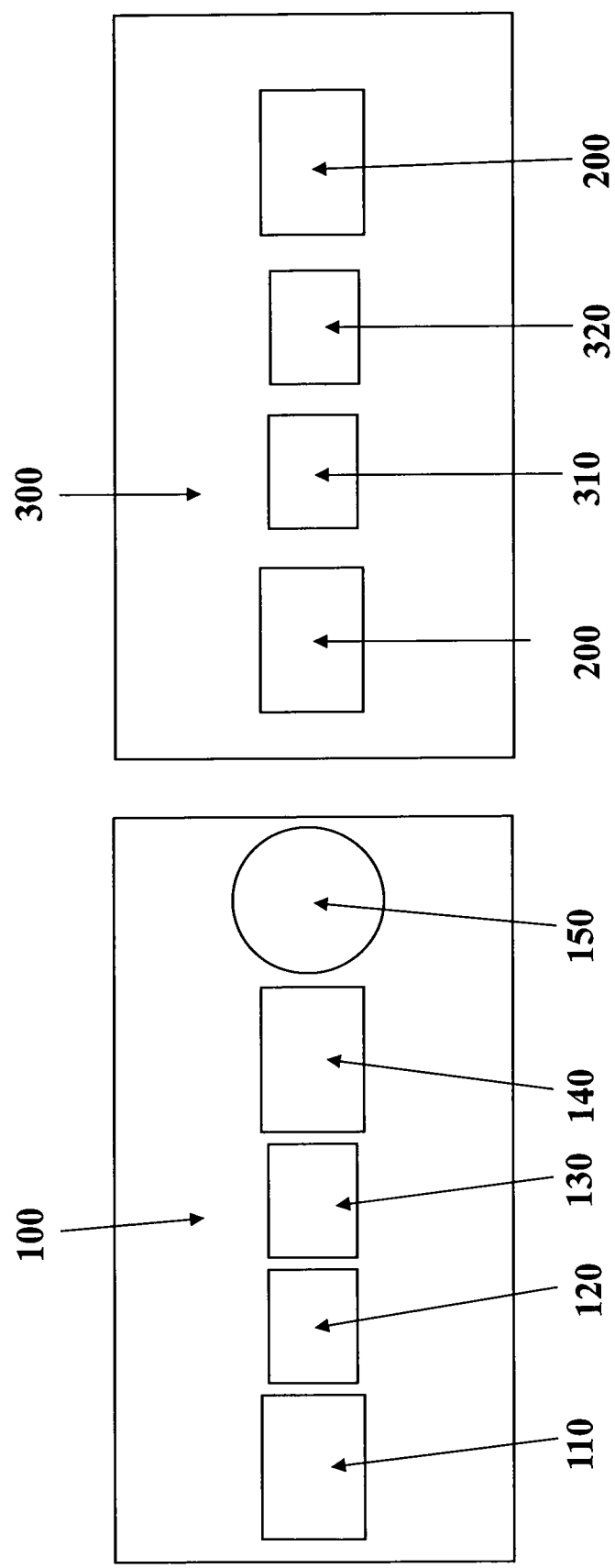
FIG. 5 is the schematic configuration of the electric ship system powered by the inflatable non-imaging non-tracking solar concentrator based portable floating photovoltaic system.

Referring to FIG. 5, the electric ship system consists of two subsystems: (1) the electric ship subsystem 100 including the battery bank 110, inverter 120, converter 130, electric control unit and battery management 140, and electric propeller 150; (2) the barge subsystem 300 including the charger 310, inverter 320, converter 330, and inflatable non-imaging non-tracking solar concentrator array 200.

Figure 6:
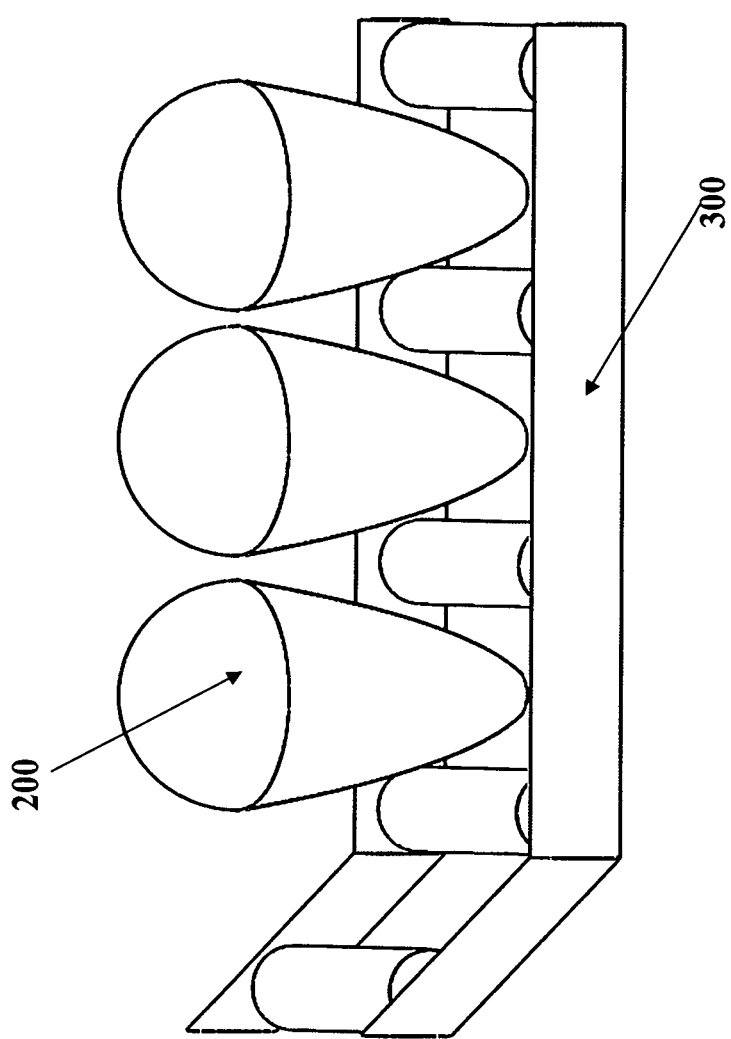
FIG. 6 is the inflatable barge equipped with the inflatable non-imaging non-tracking solar concentrator photovoltaic system.

Referring to FIG. 6, the configuration of the barge includes a inflatable rubber boat 300 and a inflatable non-imaging non-tracking solar concentrator based concentrating photovoltaic unit array 200.

Figure 7:
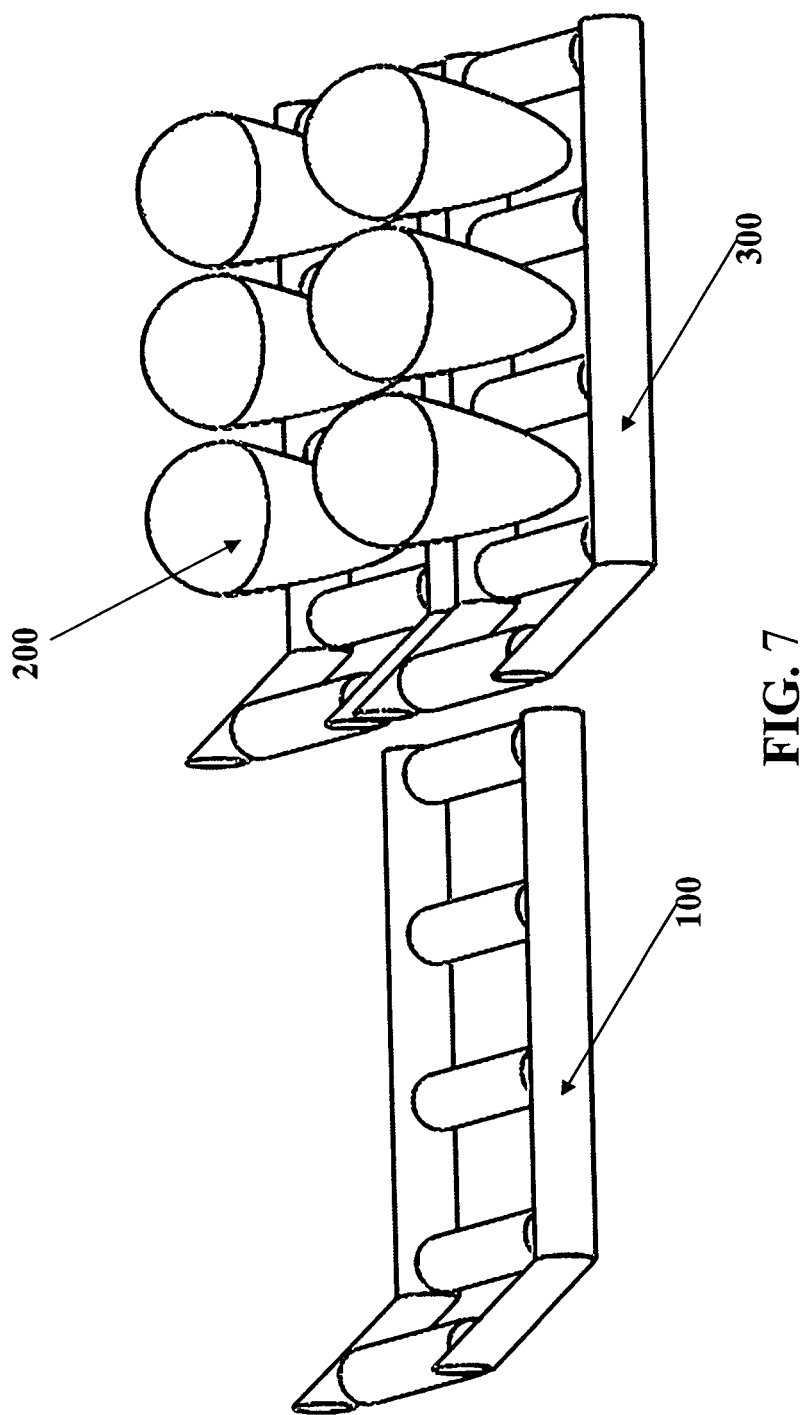
FIG. 7 is one of the configurations of the exemplary embodiments of the electric ship system powered by the inflatable non-imaging non-tracking solar concentrator based portable floating photovoltaic system.

Referring to FIG. 7, the configuration of the entire electric ship system includes the electric ship itself 100, barges 300, and inflatable non-imaging non-tracking solar concentrator based concentrating photovoltaic unit array 200.

When in operation, the electric ship drags the barges with photovoltaic systems to navigate together with it, and the barges serve as the power plants to supply power to the electric ship.

From the description above, a number of advantages of the electric ship system become evident. The solar radiation collection areas of electric ships are extended with power generation barges which are floating and portable. The heavy and low efficiency flat plate photovoltaic panels are replaced with light and high efficiency concentrating photovoltaic units. The conventional rigid body solar concentrators are replaced by the inflatable solar concentrators. The inflatable solar concentrators are non-imaging and non-tracking, which are able to concentrate both beam light and diffuse light. In summary, the present invention discloses an ultra-high efficiency, extremely low cost and super light photovoltaic system to power heavy duty ships and other ships.

In the preceding specification, various preferred embodiments have been described with reference to the accompanying drawings. It will, however, be evident that various other modifications and changes may be made thereto, and additional embodiments may be implemented, without departing from the broader scope of the invention as set forth in the claims that follow. The specification and drawings are accordingly to be regarded in an illustrative rather than restrictive sense.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

I claim:

1. An electric ship system comprises: an electric ship, multiple inflatable barges, and multiple inflatable non-imaging non-tracking solar concentrator based concentrating photovoltaic systems; the multiple inflatable non-imaging non-tracking solar concentrator based concentrating photovoltaic systems are mounted on the multiple inflatable barges; the multiple barges are connected mechanically and electrically to the said electric ship;

wherein, the multiple inflatable barges are dragged by the said electric ship to navigate together with it to supply power to it in its navigation.

2. The electric ship of claim 1, comprises a battery bank, a inverter, a converter, a electric control unit and battery management system, and a propeller.

3. The inflatable non-imaging non-tracking solar concentrator based concentrating photovoltaic system of claim 1, comprises an electric charger, a inverter, a converter, a inflatable non-imaging non-tracking solar concentrator based concentrating photovoltaic unit array with multiple inflatable non-imaging non-tracking solar concentrator based concentrating photovoltaic units.

4. The inflatable non-imaging non-tracking solar concentrator based concentrating photovoltaic unit of claim 3, comprises an inflatable non-imaging non-tracking solar concentrator and a photovoltaic receiver integrated with a heat exchanger.

5. The inflatable non-imaging non-tracking solar concentrator of claim 4, is a balloon type concentrator made of transparent film and reflective film, with its upper part transparent and its lower part reflective, as well as a bottom aperture transparent.

6. The reflective lower part of the inflatable non-imaging non-tracking solar concentrator of claim 4, is inflated into a 3 dimensional Compound Parabolic Concentrator (CPC).

\* \* \* \* \*